US006670762B2

United States Patent
Aiga et al.

(10) Patent No.: US 6,670,762 B2
(45) Date of Patent: Dec. 30, 2003

(54) MAGNETRON APPARATUS

(75) Inventors: Masayuki Aiga, Hyogo (JP); Nagisa Kuwahara, Tochigi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/285,195

(22) Filed: Oct. 31, 2002

(65) Prior Publication Data
US 2003/0090220 A1 May 15, 2003

(30) Foreign Application Priority Data

Nov. 9, 2001 (JP) ........................................ 2001-344170

(51) Int. Cl.⁷ ............................................ H01J 25/587
(52) U.S. Cl. ................. 315/39.75; 315/36.69; 315/39.71
(58) Field of Search ..................... 315/39.51, 39.67, 315/39.71, 39.75, 69.69

(56) References Cited

U.S. PATENT DOCUMENTS

| 4,105,913 A | * | 8/1978 | Yamano et al. | .......... 315/39.71 |
|---|---|---|---|---|
| 4,338,545 A | * | 7/1982 | Koinuma et al. | ........ 315/39.71 |
| 4,743,805 A | * | 5/1988 | Takada | .................... 315/39.75 |
| 5,003,223 A | * | 3/1991 | Oguro | ..................... 315/39.75 |
| 6,222,319 B1 | * | 4/2001 | Yoshihara et al. | ....... 315/39.75 |

FOREIGN PATENT DOCUMENTS

JP         2000173485 A      6/2000

* cited by examiner

*Primary Examiner*—Don Wong
*Assistant Examiner*—Thuy Vinh Tran
(74) *Attorney, Agent, or Firm*—Akin, Gump, Strauss, Hauer & Feld, L.L.P.

(57) ABSTRACT

In a magnetron apparatus in accordance with the present invention, a first notch 17, a second notch 19 and a third notch 20 are formed in each of anode segments 15 disposed radially inside an anode cylinder 6, whereby the passage of high-frequency current flowing through the resonator comprising the two anode segments 15 adjacent to each other, the anode cylinder 6 and strap rings 9 and 10 is made narrow and long.

12 Claims, 7 Drawing Sheets

MAGNETRON APPARATUS

BACKGROUND OF THE INVENTION

The present invention relates to a magnetron apparatus for use as a high-frequency generator in electric apparatuses, such as a microwave oven.

A magnetron apparatus is a microwave oscillation tube operating at a fundamental frequency of 2,450 MHz, for example. The microwave oscillation tube is used as a high-frequency generator in electric apparatuses that use microwaves, such as a microwave heater and a microwave discharge lamp. Generally, this kind of magnetron apparatus has a configuration wherein its cathode and anode are disposed coaxially and cylindrically.

FIG. 11 is a sectional view showing an internal configuration of a conventional magnetron apparatus. As shown in FIG. 11, the conventional magnetron apparatus comprises a vacuum tube portion 101 disposed at the central portion thereof, a plurality of heat radiating fins 102 disposed around the outer circumference of the vacuum tube portion 101, a pair of annular magnets 103 disposed so as to be coaxial with the vacuum tube portion 101, a pair of frame yokes 104 magnetically connected to the annular magnets 103 so as to form a magnetic circuit, and a filter circuit 105.

The vacuum tube portion 101 comprises an anode cylinder 106, a cathode 107 disposed so as to be coaxial with the anode cylinder 106, a plurality of plate-shaped anode segments 108 disposed radially around the central axis of the anode cylinder 106, two strap rings 109 and 110 for connecting these anode segments 108 alternately and electrically, and an antenna 111 for discharging microwaves, one end of which is connected to one of the anode segments 108.

As shown in FIG. 11, the strap rings 109 and 110, being large and small in diameter respectively, are connected to both the upper end face and lower end faces of the plate-shaped anode segments 108. In order that the strap rings 109 and 110 are connected to either upper or lower end face of the anode segment 108, a first recessed portion 112 is formed on one of the end faces of the anode segment 108, and a second recessed portion 113 is formed on the other end face. In addition, a groove 114 for securing the antenna 111 is formed on either one of the end faces of the anode segments 108. The anode segments 108 formed as described above are arranged so that the end faces are placed alternately. Hence, in the anode segments 108 disposed radially, the first end face of one of two anode segments adjacent to each other, wherein the first recessed portion 112 is formed, is disposed so as to face the second end face of the other anode segment, wherein the second recessed portion 113 is formed. The outer circumferential ends of the anode segments 108 disposed radially are secured to the inside wall face of the anode cylinder 106.

In recent years, in the field of electric apparatuses incorporating magnetron apparatuses, in order to pursue the development of new application apparatuses and the cultivation of new markets, compact magnetron apparatuses are desired to be developed. However, in the conventional magnetron apparatus, when the inside diameter of the anode cylinder was made smaller than its conventional value by about 35 mm in order to make the magnetron apparatus more compact, there was a problem of causing the oscillation frequency to become higher than the specified frequency. Hence, the inside diameter was unable to be made smaller simply in the configuration of the conventional magnetron apparatus. Since the anode cylinder was unable to be made smaller simply in the conventional magnetron apparatus as described above, downsizing was hampered.

The present invention is intended to solve the various problems encountered in the above-mentioned conventional apparatus and to provide a compact magnetron apparatus.

BRIEF SUMMARY OF THE INVENTION

A magnetron apparatus in accordance with the present invention comprises:

a substantially cylindrical anode cylinder, a plurality of plate-shaped anode segments which are secured to an inside wall face of the anode cylinder, and which are disposed radially around the central axis of the anode cylinder so that the main face thereof is disposed in parallel with the central axis of the anode cylinder, and a first strap ring and a second strap ring for alternately and electrically connecting the anode segments disposed radially, wherein the anode segment has a first end face disposed on a first-direction side in parallel with the central axis of the anode cylinder, a second end face disposed on a second-direction side in parallel with the central axis of the anode cylinder, a first notch formed by being cut from the first end face in substantially parallel with the central axis of the anode cylinder so that a predetermined space is arranged between the anode segment and the first strap ring, a second notch formed by being cut from the second end face in substantially parallel with the central axis of the anode cylinder so that a predetermined space is arranged between the anode segment and the second strap ring, and a third notch formed by being cut from the second end face in substantially parallel with the central axis of the anode cylinder at a position deviated with respect to the formation position of the first notch in the direction from the central axis of the anode cylinder to the outer circumference thereof. The magnetron apparatus configured as described above is provided with the anode segments having a special shape obtained by forming the notches therein. Hence, the magnetron apparatus can use the anode cylinder smaller in inside diameter than that of the conventional apparatus and the plate-shaped anode segments smaller in size than those of the conventional apparatus. Accordingly, in the magnetron apparatus in accordance with the present invention, the passage of high-frequency current flowing through the resonator comprising the anode segments adjacent to each other, the anode cylinder and the strap rings is formed so as to be bent, narrow and long. Therefore, even when the anode cylinder smaller in inside diameter than that of the conventional apparatus and the plate-shaped anode segments smaller in size than those of the conventional apparatus are used, the magnetron apparatus in accordance with the present invention can have an inductance similar to that of the conventional magnetron apparatus.

In the magnetron apparatus in accordance with the present invention, a groove for securing a microwave discharging antenna may be formed in the first end face of the anode segment at a position different from the formation position of the first notch.

In the magnetron apparatus in accordance with the present invention, the depth of the first notch may be larger than the distance between the bottom of the first notch and the second end face.

In the magnetron apparatus in accordance with the present invention, the depth of the third notch may be larger than the distance between the bottom of the third notch and the first end face.

In the magnetron apparatus in accordance with the present invention, the depth of the first notch may be different from the depth of the third notch.

In the magnetron apparatus in accordance with the present invention, the depth of the first notch may be substantially identical to the depth of the third notch.

In the magnetron apparatus in accordance with the present invention, the first notch and the third notch may have rectangular shapes.

In the magnetron apparatus in accordance with the present invention, the first notch and the third notch may have curved shapes.

In the magnetron apparatus in accordance with the present invention, the first notch and the third notch may be formed so as to have sides inclined with respect to the central axis of the anode cylinder.

In the magnetron apparatus in accordance with the present invention, the anode segment may be formed so that the passage of high-frequency current is bent by the first notch and the third notch.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all of the drawings are schematic representations for purposes of illustration and do not necessarily depict the actual relative sizes or locations of the elements shown.

DETAILED DESCRIPTION OF THE INVENTION

Magnetron apparatuses in accordance with preferable embodiments of the present invention will be described below referring to the accompanying drawings.

<<Embodiment 1>>

Figure 1:
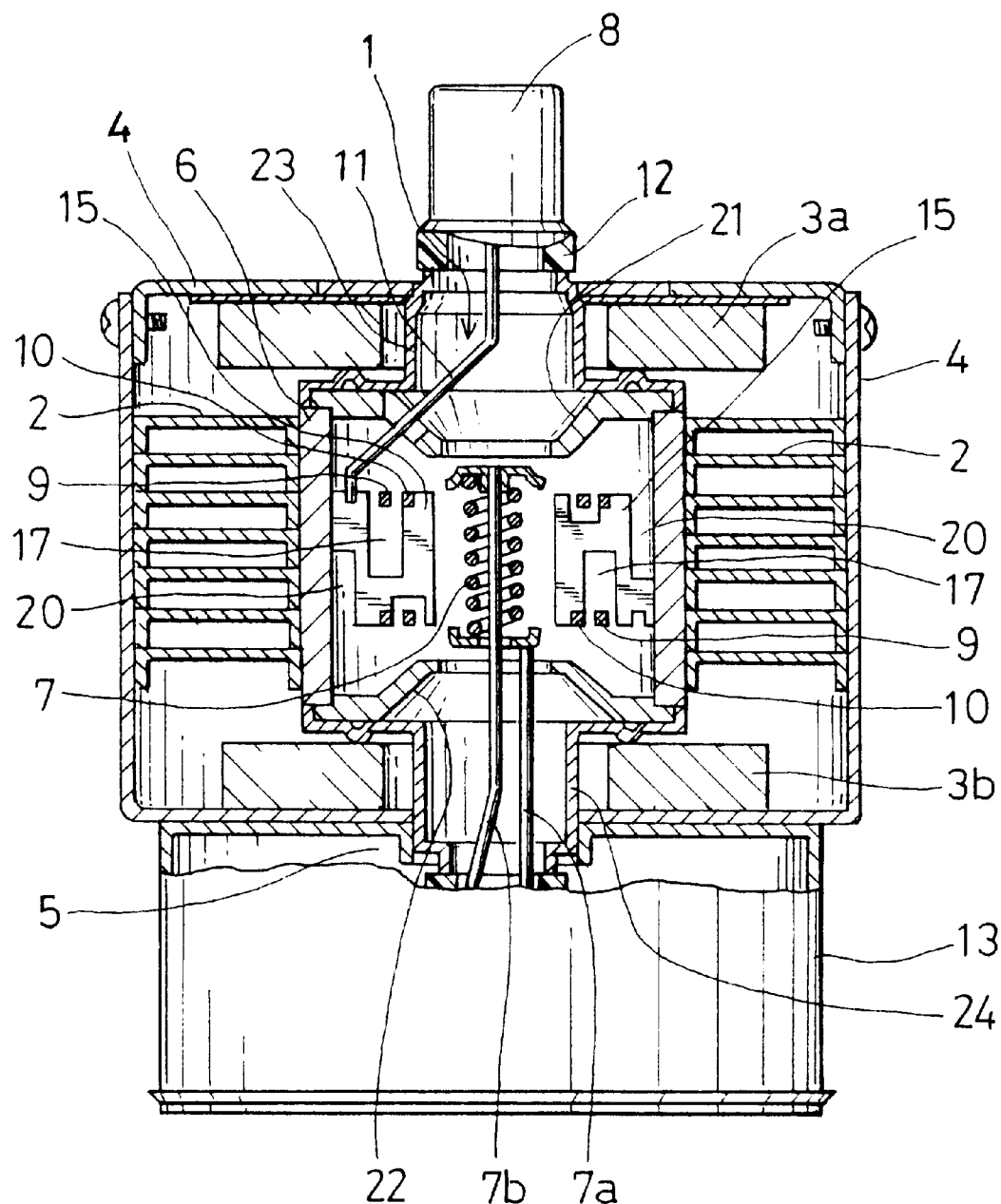
FIG. 1 is a partially cutaway sectional view showing an inner configuration of a magnetron apparatus in accordance with Embodiment 1 of the present invention.
Figure 2:
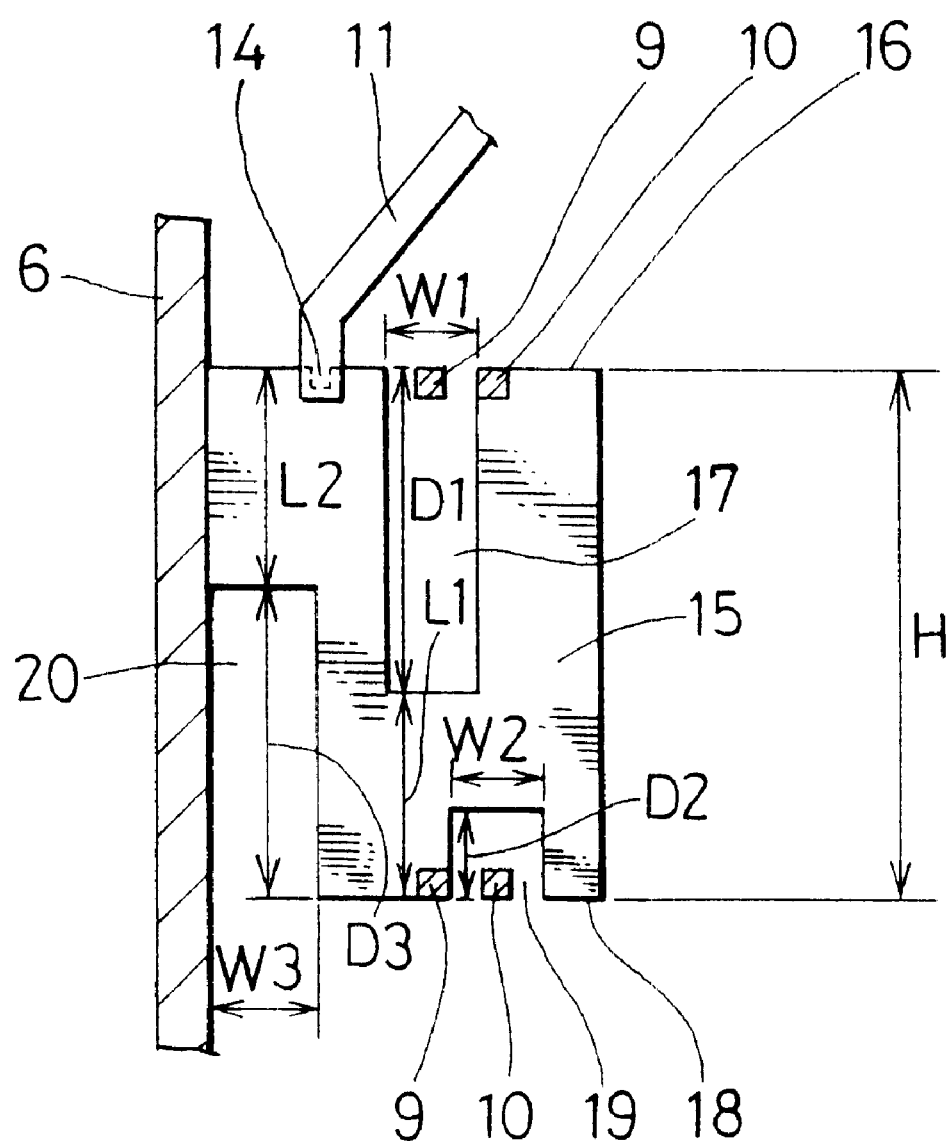
FIG. 2 is a partially magnified sectional view showing the inner configuration of the magnetron apparatus in accordance with Embodiment 1 of the present invention.
Figure 3:
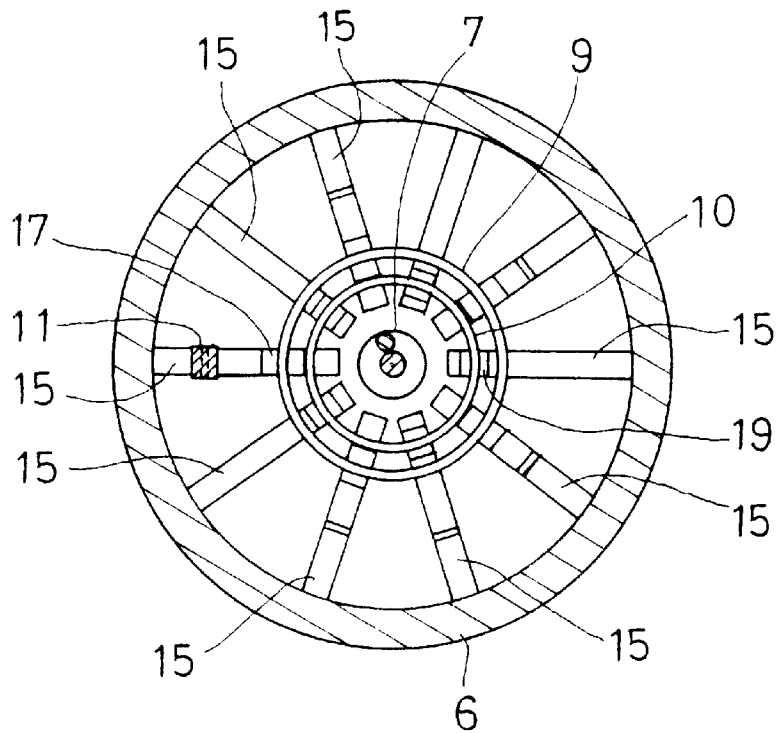
FIG. 3 is a plan view showing the arrangement of the anode cylinder, anode segments, etc. of the magnetron apparatus in accordance with Embodiment 1 of the present invention.

FIG. 1 is a partially cutaway sectional view showing an inner configuration of a magnetron apparatus in accordance with Embodiment 1 of the present invention. FIG. 2 is an enlarged sectional view showing the main components, that is, the anode cylinder and anode segments, of the magnetron apparatus in accordance with Embodiment 1. FIG. 3 is a plan view showing the anode segments disposed radially inside the anode cylinder of the magnetron apparatus in accordance with Embodiment 1.

As shown in FIG. 1, the magnetron apparatus in accordance with Embodiment 1 comprises a vacuum tube portion 1 disposed at the center thereof, heat radiating fins 2 disposed around the outer circumference of the vacuum tube portion 1, a pair of upper and lower annular permanent magnets 3a and 3b disposed so as to be coaxial with the vacuum tube portion 1, a pair of frame yokes 4 magnetically connected to the permanent magnets 3a and 3b so as to form a magnetic circuit, and a filter circuit 5.

The vacuum tube portion 1 comprises an anode cylinder 6, a cathode 7 disposed along the central axis of the anode cylinder 6, a plurality of plate-shaped anode segments 15 disposed radially around the central axis of the anode cylinder 6 at equally spaced intervals, two strap rings 9 and 10 for connecting these anode segments 15 alternately and electrically, and an antenna 11 for discharging microwaves, one end of which is connected to one of the anode segments 15.

In FIG. 1, first and second metal cylinders 23 and 24 provided with first and second magnetic pole pieces 21 and 22 respectively are installed at the upper and lower open ends of the anode cylinder 6, respectively. The outer circumferential end face of the first magnetic pole piece 21 is covered with a flange portion provided at one end of the first metal cylinder 23. The outer circumferential rim of the flange portion is secured to the upper open end of the anode cylinder 6.

At the other end of the first metal cylinder 23, a microwave output terminal 8 is installed so as to be sealed via an insulation ring 12. In a similar way, the outer circumferential end face of the second magnetic pole piece 22 is covered with a flange portion provided at one end of the second metal cylinder 24. The outer circumferential rim of the flange portion is secured to the lower open end of the anode cylinder 6.

As shown in FIG. 1, on the outer circumferential face of the anode cylinder 6, the plurality of heat radiating fins 2 are disposed in multiple stages in order to radiate heat generated inside the anode cylinder 6. The outer circumferential end face of the first magnetic pole piece 21 is fixed to a flange portion of the first metal cylinder 23. Above the outer circumferential end face of the first magnetic pole piece 21, the first annular permanent magnet 3a is disposed coaxially on the flange portion of the first metal cylinder 23. The first permanent magnet 3a is magnetically coupled to the first magnetic pole piece 21. In a similar way, the outer circumferential end face of the second magnetic pole piece 22 is fixed to a flange portion of the second metal cylinder 24. Below the outer circumferential end face of the second metal cylinder 24, the second annular permanent magnet 3b is disposed coaxially on the flange portion of the second metal cylinder 24. The second permanent magnet 3b is magnetically coupled to the second magnetic pole piece 22. Furthermore, at the lower portion of the pair of frame yokes 4 enclosing the first and second permanent magnets 3a and 3b and the heat radiating fins 2, a metallic shield case 13 incorporating the filter circuit 5 comprising LC filter circuit components and the like is installed in order to prevent leakage of high-frequency noise.

Inside the anode cylinder 6, the coil-shaped cathode 7 is disposed along the central axis thereof. Furthermore, the anode segments 15 are disposed coaxially and radially around the cathode 7. The cathode 7 is connected to a pair of cathode terminals 7a and 7b inside the anode cylinder 6. Inside the metallic shield case 13, the cathode terminals 7a and 7b are led out from the inside of the anode cylinder 6 through cathode terminal lead-out stems (not shown) and connected to a high-frequency power source (not shown).

Inside the anode cylinder 6, the outer circumferential ends of the anode segments 15 disposed radially are secured to the inside wall face of the anode cylinder 6. The number of the anode segments 15 is an even number. In Embodiment 1, 10 anode segments are used. The anode segment 15 is formed of a plate measuring 9.5 mm in height, 7.0 mm in width and 2.0 mm in thickness, for example. Inside the anode cylinder 6, the antenna 11 connected to one of the anode segments 15 is also connected to the microwave output terminal 8. A microwave having a fundamental frequency of 2,450 MHz, for example, is output from the microwave output terminal 8.

In Embodiment 1, the anode cylinder 6, the anode segments 15, the strap rings 9 and 10 and the antenna 11 are made of the same metallic material, such as oxygen-free copper. These are secured by a pressure brazing method using a brazing material made of an alloy of silver and copper.

As shown in FIG. 1, the two strap rings 9 and 10, being large and small in diameter respectively, are disposed on both the upper and lower end faces of the plurality of anode segments 15 disposed radially. Each of the two strap rings 9 and 10 makes contact with every other anode segment of the plurality of anode segments 15 disposed radially. In order to connect the strap rings 9 and 10 at the desired positions on both the upper and lower end faces of the anode segments 15 as described above, a first notch 17 is formed in one end face 16 of the anode segment 15 (the upper end face of the anode segment 15 in FIG. 2). In addition, a second notch 19 is formed in the other end face 18 thereof (the lower end face of the anode segment 15 in FIG. 2). The first notch 17 and the second notch 19 are recessed portions having rectangular shapes when viewed in the direction of the thickness of the anode segment 15, that is, in a direction perpendicular to the main face of each of the anode segments 15 disposed radially. These notches are formed by cutting.

In addition, as shown in FIG. 2, one end of the antenna 11 is secured to a groove 14 formed in the upper end face of the anode segment 15. The anode segment 15 to which the one end of the antenna 11 is connected is one of the plurality of anode segments 15 disposed radially as described above.

Figure 4:
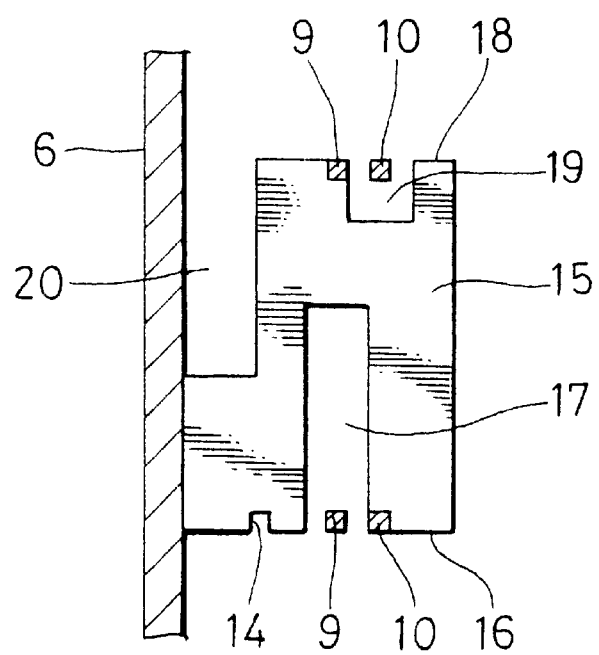
FIG. 4 is a sectional view showing the shape of another anode segment of the magnetron apparatus in accordance with Embodiment 1 of the present invention.

FIG. 4 shows the shape of the anode segment 15 arranged so as to face and be adjacent to the anode segment 15 shown in FIG. 2. The anode segment 15 shown in FIG. 4 is the same as the anode segment 15 shown in FIG. 2 in shape, but has a shape inverted in the vertical direction and is secured to the anode cylinder 6. Hence, in these anode segments 15 disposed radially as described above, the first end face 16 in which the first notch 17 is formed and the second end face 18 in which the second notch 19 is formed are arranged so as to be alternately inverted in the vertical direction.

Next, a specific shape of the anode segment 15 of the magnetron apparatus in accordance with Embodiment 1 will be described below.

In the first end face 16 of the anode segment 15 shown in FIG. 2, the first and second annular strap rings 9 and 10, being large and small in diameter and used as a pair, are disposed on a substantially identical plane. The first notch 17 formed in the first end face 16 is formed so that the first strap ring 9 does not make contact with the anode segment 15. The depth of the first notch 17 is D1, and the width thereof is W1. The depth D1 of the first notch 17 is not less than half the height H of the anode segment 15. Herein, the height H of the anode segment 15 is the distance between the first end face 16 and the second end face 18. The second strap ring 10 is secured to the first end face 16 of the anode segment 15 shown in FIG. 2.

On the other hand, in the second end face 18 of the anode segment 15, that is, on the opposite side of the first end face 16, the first and second annular strap rings 9 and 10, being large and small in diameter and used as a pair, are similarly disposed on a substantially identical plane. The second notch 19 formed in the second end face 18 is formed so that the second strap ring 10 does not make contact with the anode segment 15. The depth of the second notch 19 is D2, and the width thereof is W2. The second notch 19 is formed so as to have a predetermined distance from the bottom of the first notch 17. The first strap ring 9 is secured to the second end face 18 of the anode segment 15 shown in FIG. 2.

Furthermore, as shown in FIG. 2, in the second end face 18, a third notch 20 is formed at a position different from the formation position of the second notch 19 and completely deviated from the formation position of the first notch 17 formed in the first end face 16. In other words, the third notch 20 formed in the second end face 18 and the first notch 17 formed in the first end face 16 are formed in parallel with the central axis of the anode cylinder 6 but deviated from each other. The depth of the third notch 20 is D3, and the width thereof is W3. The depth D3 of the third notch 20 is not less than half the height H of the anode segment 15.

In FIG. 2, the distance between the bottom of the first notch 17 and the second end face 18 is designated by L1, and the distance between the first end face 16 and the bottom of the third notch 20 and designated by L2.

In the magnetron apparatus in accordance with Embodiment 1 of the present invention, the depth D1 of the first notch 17 is made larger than the distance L1. In addition, the depth D3 of the third notch 20 is made larger than the distance L2. Hence, in each anode segment 15, the passage of current from the cathode to the anode cylinder is formed so as not to be straight but bent.

Next, a specific example of the magnetron apparatus in accordance with Embodiment 1 of the present invention will be described as a first example.

In the first example, the depth D2 of the second notch 19 of the anode segment 15 is 1.7 mm, a value identical to the depth of the notch of the anode segment of the conventional magnetron apparatus. The depth D1 of the first notch 17 is 5.8 mm, and the depth D3 of the third notch 20 is 7.5 mm. In this magnetron apparatus comprising the anode segments 15 configured as described above oscillated at 2,450 MHz when the inside diameter of the anode cylinder 6 was 22.0 mm. This inside diameter of the anode cylinder 6 is smaller by 13 mm compared with the inside diameter, 35 mm, of the anode cylinder of the conventional magnetron apparatus. The anode cylinder 6 can thus be made more compact significantly.

Figure 5:
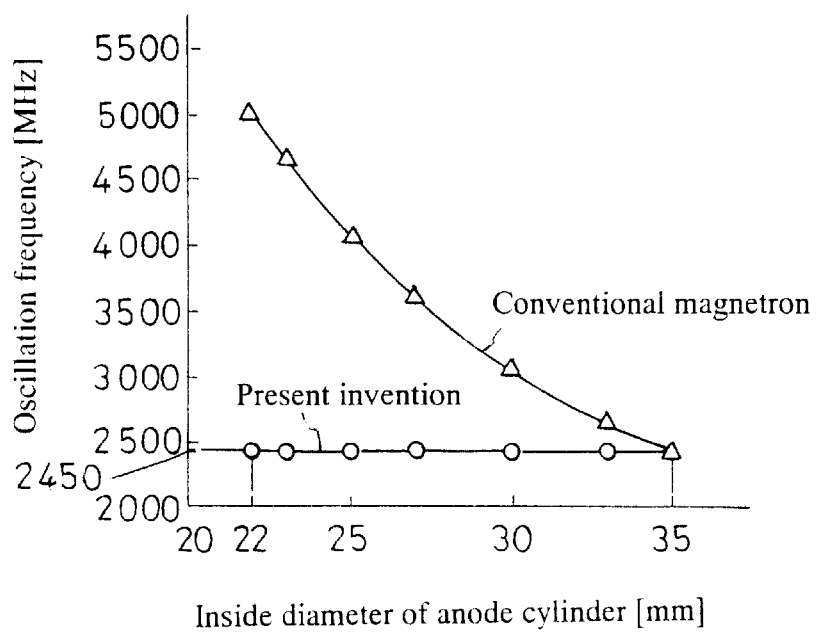
FIG. 5 is a graph showing the relationship of the inside diameter of the anode cylinder and oscillation frequency of the magnetron apparatus in accordance with the present invention in comparison with the conventional magnetron apparatus.

FIG. 5 shows the result of an experiment wherein the magnetron apparatus in accordance with the present invention configured as described above is compared with the conventional magnetron apparatus. In FIG. 5, the abscissa represents the inside diameter [mm] of the anode cylinder 6, and the ordinate represents oscillation frequency [MHz]. FIG. 5 also shows results obtained when the inside diameter of the anode cylinder 6 was set to have values other than the value for the first embodiment. Furthermore, FIG. 5 also shows the change of oscillation frequency when the inside diameter of the anode cylinder of the conventional magnetron apparatus was changed, as a comparison example.

As clarified by the graph of FIG. 5, in the magnetron apparatus in accordance with the present invention, the oscillation frequency remains unchanged even when the inside diameter of the anode cylinder 6 is changed. According to the experiment conducted by the inventors, the variation of the oscillation frequency was within ±10 MHz even when the inside diameter of the anode cylinder 6 was changed from 22 mm to 35 mm.

The first example was explained by taking the example wherein the depth D1 of the first notch 17 is different from the depth D3 of the third notch 20. However, even when the depth D1 of the first notch 17 is made substantially identical to the depth D3 of the third notch 20, the inside diameter of the anode cylinder 6 can be made smaller. This has been confirmed by mean of an experiment conducted by the inventors.

In the magnetron apparatus in accordance with the present invention configured as described above, the inside diameter of the anode cylinder 6 can be made smaller than the inside diameter of the anode cylinder of the conventional magnetron apparatus. In the magnetron apparatus in accordance with the present invention, the passage of high-frequency current flowing through the resonator comprising the two anode segments 15 adjacent to each other, the anode cylinder 6 and the strap rings 9 and 10 can be made narrow and long. Hence, the magnetron apparatus in accordance with the present invention can have an inductance similar to that of the conventional magnetron apparatus. As a result, the present invention can provide a compact magnetron apparatus operating at the same oscillation frequency as that of the conventional magnetron apparatus.

Figure 6:
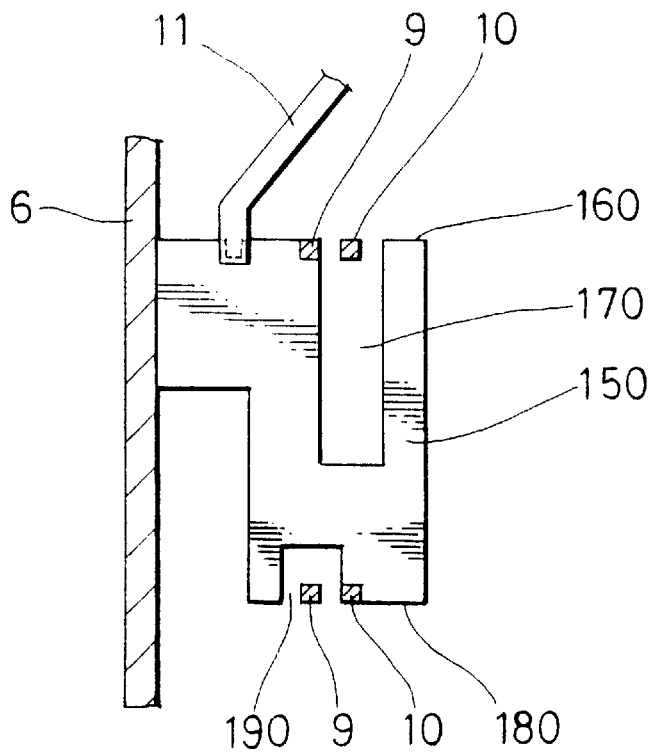
FIG. 6 is a sectional view showing the shape of the anode segment of the magnetron apparatus in accordance with another embodiment of the present invention.

In the magnetron apparatus in accordance with Embodiment 1 shown in FIG. 2, on the side of the first end face 16 of the anode segment 15, the first notch 17 is formed to have the depth D1 so that the first strap ring 9 does not make contact with the anode segment 15, and the second strap ring 10 is secured to this anode segment 15. Furthermore, on the side of the second end face 18 of the anode segment 15, that is, on the opposite side of the first end face 16, the second notch 19 is formed to have the depth D2 so that the second strap ring 10 does not make contact with the anode segment 15, and the first strap ring 9 is secured to this anode segment 15. However, the magnetron apparatus in accordance with the present invention is not limited to be provided with the anode segments 15 having the shape described above. For example, the anode segment 150 shown in FIG. 6, although different from the anode segment 15 shown in FIG. 2 in shape, has an effect similar to that of the above-mentioned Embodiment 1. As shown in FIG. 6, on the side of the first end face 160 of this anode segment 150, a first notch 170 is formed so that the second strap ring 10 does not make contact with the anode segment 150, and the first strap ring 9 is secured to the anode segment 150. On the other hand, on the side of the second end face 180 thereof, a second notch 190 is formed so that the first strap ring 9 does not make contact with the anode segment 150, and the second strap ring 10 is secured to the anode segment 150.

Figure 7:
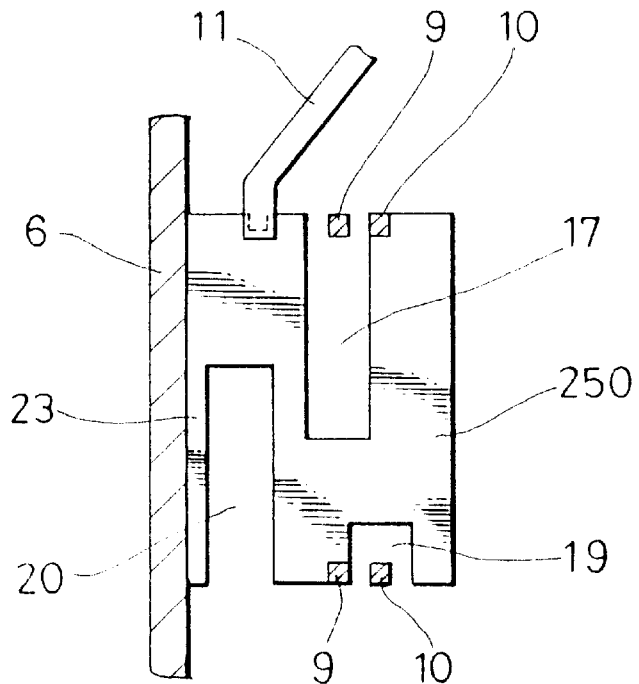
FIG. 7 is a sectional view showing the shape of the anode segment of the magnetron apparatus in accordance with still another embodiment of the present invention.
Figure 8:
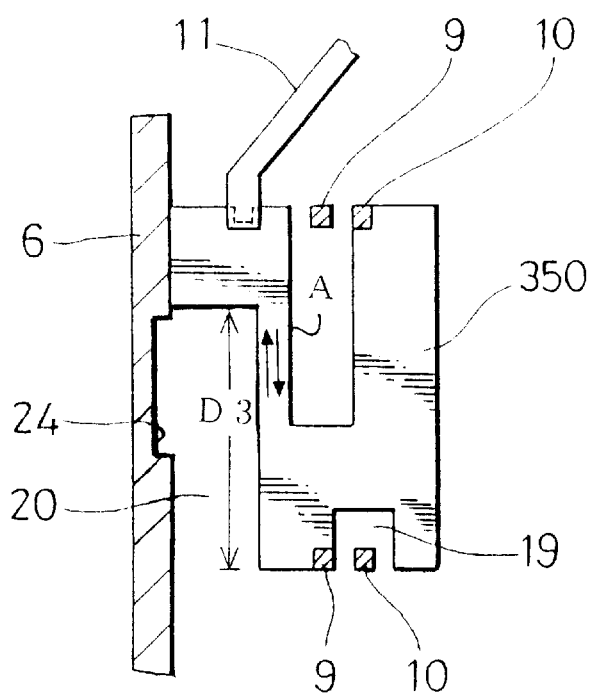
FIG. 8 is a sectional view showing the shape of the anode segment of the magnetron apparatus in accordance with yet still another embodiment of the present invention.

FIG. 7 and FIG. 8 are sectional views showing still other embodiments of the present invention. In the anode segment 250 shown in FIG. 7, the portion secured to the inner wall face of the anode cylinder 6 is made longer. In other words, in the anode segment 250 shown in FIG. 7, a projecting portion 23 is formed on the side of the anode cylinder 6, wherein the third notch 20 is formed. This has the effect of making the face secured to the anode cylinder 6 larger.

In the anode segment 350 shown in FIG. 8, the depth (D3) of the third notch 20 is made larger than that in the above-mentioned anode segment 15 shown in FIG. 2. In addition, in the anode cylinder 6 shown in FIG. 8, a recessed portion 24 is formed in a part of the inner wall face of the anode cylinder 6 so as to face the third notch 20. This recessed portion 24 is formed so that its central position in the vertical direction is the same as the central position of the anode segment 350 in the vertical direction. By forming the recessed portion 24 in the part of the inner wall face of the anode cylinder 6, the magnetic field generated by the current flowing through the anode segment 350 is not limited by the anode cylinder 6, whereby a sufficient inductance can be obtained. The resonance frequency of a cavity resonator is expressed by $fr = \frac{1}{2\pi}\sqrt{(LC)}$. In this equation, L is an inductance component, and C is a capacitance component. This equation represents the general oscillation frequency of a magnetron apparatus having a resonator comprising anode segments, an anode cylinder and strap rings.

When current flows in the directions indicated by the arrows in the vertically narrow portion A of the anode segment 350 shown in FIG. 8, a magnetic field is generated around the portion. If the inner wall face of the anode cylinder 6 serving as a conductor is close to this narrow portion A, the above-mentioned magnetic field is limited, and the inductance component (L) of the above-mentioned equation becomes small. As a result, the oscillation frequency of the magnetron apparatus becomes high. Hence, in the anode cylinder 6 of the magnetron apparatus shown in FIG. 8, the recessed portion 24 is formed in the part of the inner wall face of the anode cylinder 6 so that the wall face of the anode cylinder 6 does not obstruct the above-mentioned magnetic field, in order to obtain a sufficient inductance component. As a result, the magnetron apparatus shown in FIG. 8 can obtain an inductance equivalent to or slightly larger than that of the conventional magnetron apparatus. Therefore, the present invention can provide a compact magnetron apparatus, the oscillation frequency of which is the same as that of the conventional magnetron apparatus.

Figure 9:
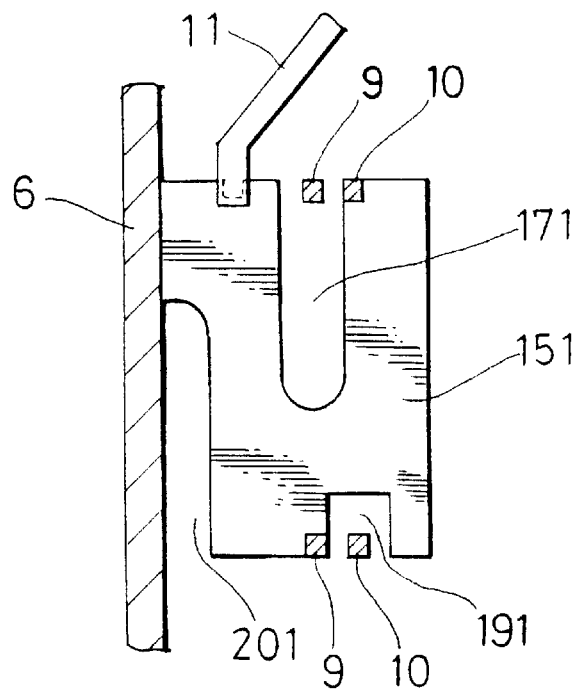
FIG. 9 is a sectional view showing the shape of the anode segment of the magnetron apparatus in accordance with a further embodiment of the present invention.
Figure 10:
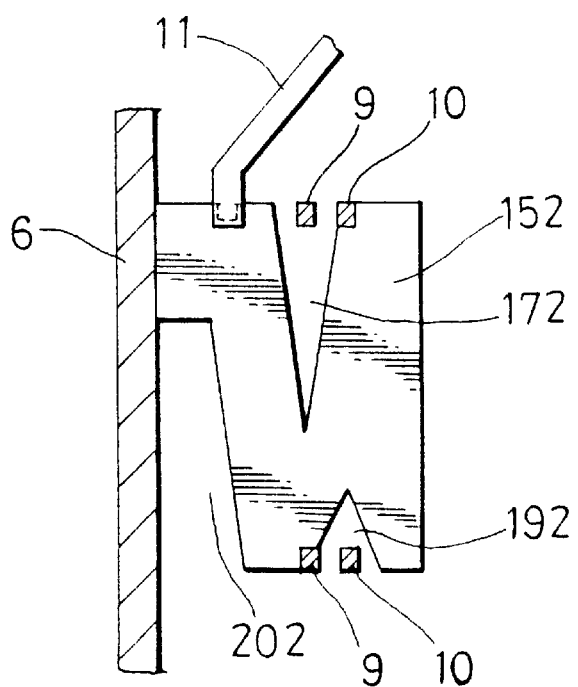
FIG. 10 is a sectional view showing the shape of the anode segment of the magnetron apparatus in accordance with a still further embodiment of the present invention.
Figure 11:
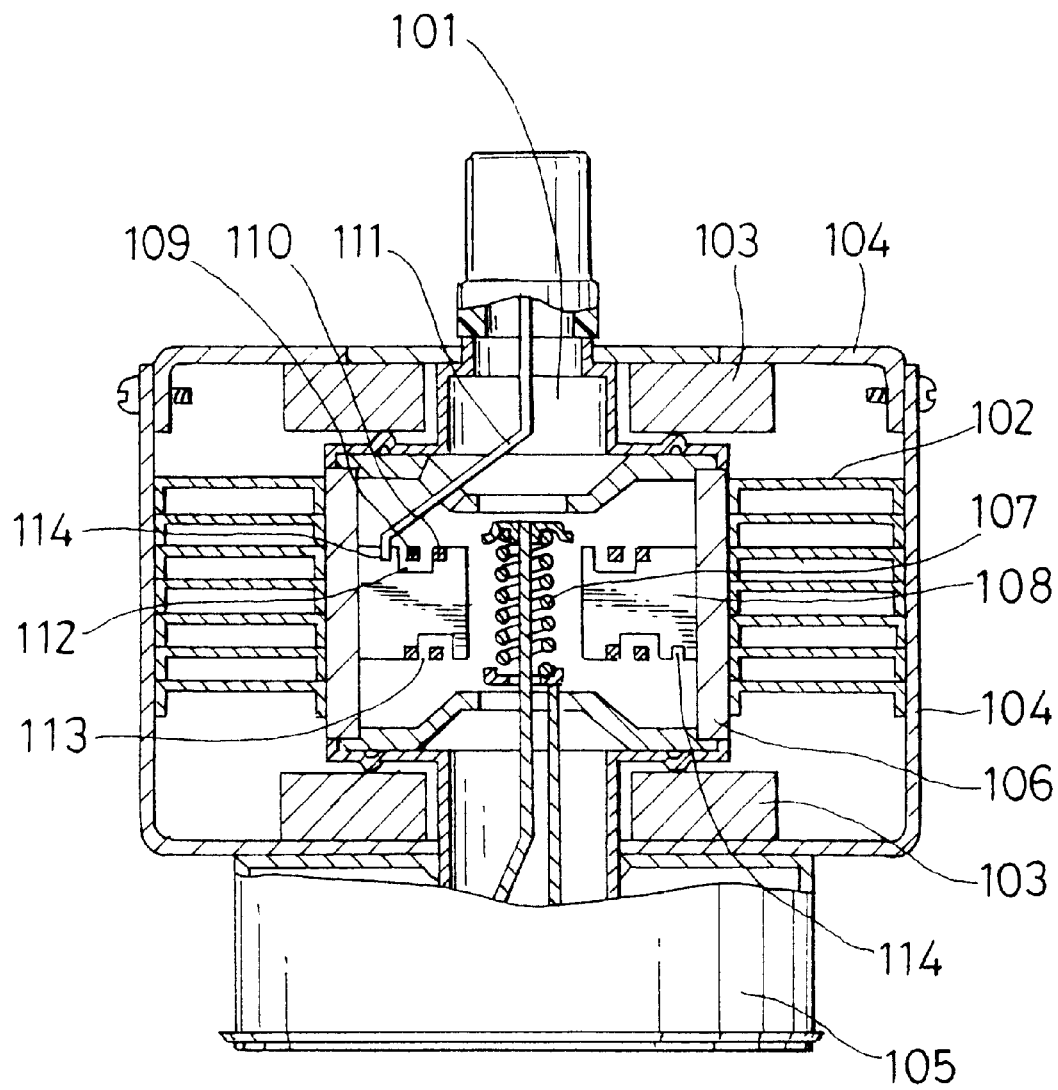
FIG. 11 is the partially cutaway sectional view showing the inner configuration of the conventional magnetron apparatus.

In the above-mentioned embodiment, it is explained that the first notch 17 and the third notch 20 are rectangular in shape. However, the present invention is not limited to this shape. FIG. 9 and FIG. 10 are views showing other specific shapes of the anode segment in accordance with the present invention. FIG. 9 shows an anode segment 151 provided with a first notch 171 and a third notch 201, each having a circular shape. FIG. 10 shows an anode segment 152 provided with a first notch 172, a second notch 192 and a third notch 202, the sides of which are inclined with respect to the central axis of the anode cylinder 6.

By using the anode segments 151 and 152 having the above-mentioned shapes, the passage of the high-frequency current can be made longer. Therefore, the present invention can provide a compact magnetron apparatus operating at a desired high frequency, just as in the case of the above-mentioned Embodiment 1.

Embodiment 1 was explained by taking the example of the magnetron apparatus wherein the central axis of anode cylinder 6 is set in the vertical direction. However, the magnetron apparatus in accordance with the present invention is not limited to the case of this directional setting. The magnetron apparatus in accordance with the present invention configured as described above has an effect similar to that of the above-mentioned embodiment, regardless of the direction of the central axis of the anode cylinder 6.

Accordingly, with the present invention, even when the anode cylinder-smaller than the conventional anode cylinder in inside diameter is used, by forming notches in the anode cylinder segments, the resonator comprising the two anode segments adjacent to each other, the anode cylinder and the strap rings can be made narrow and long. Hence, the magnetron apparatus in accordance with the present invention can obtain an inductance equivalent to that of the conventional magnetron apparatus. As a result, the present invention can provide a compact magnetron apparatus, the oscillation frequency of which is the same as that of the conventional magnetron apparatus.

Although the present invention has been described with respect to its preferred embodiments in some detail, the disclosed contents of the preferred embodiments may change in the details of the structure thereof, and any changes in the combination and sequence of the components may be attained without departing from the scope and spirit of the claimed invention.

What is claimed is:

1. A magnetron apparatus comprising:

a substantially cylindrical anode cylinder, a plurality of plate-shaped anode segments which are secured to an inside wall face of said anode cylinder, and which are disposed radially around the central axis of said anode cylinder so that a main face thereof is disposed in parallel with a central axis of said anode cylinder, and a first strap ring and a second strap ring for alternately and electrically connecting said anode segments disposed radially, wherein each of said plurality of anode segments has a first end face disposed on a first-direction side in parallel with the central axis of said anode cylinder, a second end face disposed on a second-direction side in parallel with the central axis of said anode cylinder, a first notch formed by being cut from said first end face in substantially parallel with the central axis of said anode cylinder so that a predetermined space is arranged between said anode segment and said first strap ring, a second notch formed by being cut from said second end face in substantially parallel with the central axis of said anode cylinder so that a predetermined space is arranged between said anode segment and said second strap ring, and a third notch formed by being cut from said second end face in substantially parallel with the central axis of said anode cylinder at a position deviated with respect to a formation position of said first notch in a direction from the central axis of said anode cylinder to the outer circumference thereof.

2. A magnetron apparatus in accordance with claim 1, wherein a groove for securing a microwave discharging antenna is formed in the first end face of the anode segment at a position different from the formation position of said first notch.

3. A magnetron apparatus in accordance with claim 1, wherein the depth of said first notch is larger than a distance between the bottom of said first notch and said second end face.

4. A magnetron apparatus in accordance with claim 3, wherein the depth of said first notch is different from the depth of said third notch.

5. A magnetron apparatus in accordance with claim 3, wherein the depth of said first notch is substantially identical to the depth of said third notch.

6. A magnetron apparatus in accordance with claim 1, wherein the depth of said third notch is larger than a distance between the bottom of said third notch and said first end face.

7. A magnetron apparatus in accordance with claim 6, wherein the depth of said first notch is different from the depth of said third notch.

8. A magnetron apparatus in accordance with claim 6, wherein the depth of said first notch is substantially identical to the depth of said third notch.

9. A magnetron apparatus in accordance with claim 1, wherein said first notch and said third notch have rectangular shapes.

10. A magnetron apparatus in accordance with claim 1, wherein said first notch and said third notch have curved shapes.

11. A magnetron apparatus in accordance with claim 1, wherein said first notch and said third notch are formed so as to have sides inclined with respect to the central axis of said anode cylinder.

12. A magnetron apparatus in accordance with claim 1, wherein said anode segment is formed so that a passage of high-frequency current is bent by said first notch and said third notch.

* * * * *